United States Patent
Benmouyal (10) Patent No.: US 8,108,165 B2
(45) Date of Patent: Jan. 31, 2012

(54) ACQUIRING PHASORS OUTSIDE THE FREQUENCY TRACKING RANGE FOR POWER PROTECTIVE RELAYS

(75) Inventor: Gabriel Benmouyal, Boucherville (CA)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 959 days.

(21) Appl. No.: 12/098,221

(22) Filed: Apr. 4, 2008

(65) Prior Publication Data

US 2009/0254291 A1 Oct. 8, 2009

(51) Int. Cl.
*G01R 23/00* (2006.01)

(52) U.S. Cl. ......................................................... 702/75

(58) Field of Classification Search ...................... 702/75
See application file for complete search history.

(56) References Cited

U.S. PATENT DOCUMENTS

| | | |
|---|---|---|
| 4,636,909 A | 1/1987 | Brandt |
| 4,672,501 A | 6/1987 | Bilac |
| 4,715,000 A | 12/1987 | Premerlani |
| 4,829,298 A | 5/1989 | Fernandes |
| 5,006,846 A | 4/1991 | Granville |
| 5,224,011 A | 6/1993 | Yalla |
| 5,398,029 A | 3/1995 | Toyama |
| 5,446,682 A | 8/1995 | Janke |
| 5,498,956 A | 3/1996 | Kinney |
| 5,592,393 A | 1/1997 | Yalla |
| 5,805,395 A | 9/1998 | Hu |
| 5,809,045 A | 9/1998 | Adamiak |
| 5,995,911 A | 11/1999 | Hart |
| 6,141,196 A | 10/2000 | Premerlani |
| 6,148,267 A | 11/2000 | Premerlani |
| 6,236,949 B1 | 5/2001 | Hart |
| 6,311,307 B1 | 10/2001 | Adamiak |
| 6,426,856 B1 | 7/2002 | Schneerson |
| 6,446,682 B1 | 9/2002 | Viken |
| 6,456,947 B1 | 9/2002 | Adamiak |
| 6,571,182 B2 | 5/2003 | Adamiak |
| 6,603,298 B2 | 8/2003 | Guzman-Casillas |
| 6,662,124 B2 | 12/2003 | Schweitzer |
| 6,845,333 B2 | 1/2005 | Anderson |
| 6,934,654 B2 | 8/2005 | Benmouyal |
| 7,328,114 B2 | 2/2008 | Premerlani |
| 2001/0012984 A1 | 8/2001 | Adamiak |
| 2004/0186669 A1* | 9/2004 | Benmouyal .................... 702/57 |

(Continued)

OTHER PUBLICATIONS

PCT, Written Opinion of the International Searching Authority for PCT/US2009/038996, Jun. 2, 2009.

(Continued)

*Primary Examiner* — Cindy H Khuu
(74) *Attorney, Agent, or Firm* — Richard M. Edge (57) ABSTRACT

A system and method for acquiring phasors outside of the frequency tracking range for power protective relays. As the frequency of a power system varies from the rated frequency, phasors calculated from such samples include errors. A frequency tracking range is used to sample the signal waveform at a rate corresponding to the frequency when the frequency is within the frequency tracking range. When the frequency is outside of the frequency tracking range, the signal waveform is sampled at a rate corresponding with the maximum or minimum of the frequency tracking range depending on whether the frequency exceeds or falls below the frequency tracking range. The difference between the frequency and the minimum or maximum of the frequency tracking range is used to correct the measured phasors to result in accurate phasors.

24 Claims, 6 Drawing Sheets

U.S. PATENT DOCUMENTS

2007/0008033 A1    1/2007    Okazaki
2007/0086134 A1    4/2007    Zweigle
2007/0136013 A1*    6/2007    Premerlani et al. ............. 702/75

OTHER PUBLICATIONS

PCT, International Search Report for PCT/US2009/038996, Jun. 2, 2009.

Phadke, et. al., A new Measurement Technique for Tracking Voltage Phasors, Local System Frequency, and Rate of Change of Frequency, IEEE Trans. On Power Apparatus and Systems, vol. PAS-102, No. 5, May 1983.

Stenbakken, et. al., Reference Values for Dynamic Calibration of PMUs, Proceedings of the 41st Hawaii International Conference on System Sciences—2008.

Hou, Relay Element Performance During Power System Frequency Excursions, Aug. 2007 http://www.selinc.com/techpprs/6292_RelayElement_DH_20070824.pdf.

Moore, et. al., Frequency Relaying Based on Instantaneous Frequency Measurement, IEEE 96 WM 066-1 PWRD, 1996.

Chattopadhyay, et. al., A New Frequency Measurement Algorithm in the Presence of Harmonics Using Instantaneous Phasor Quantities, IEEE 0-7803-3143-5, pp. 130-133, 1996.

Sidhu, et. al., An Iterative DSP Technique for Tracking Power System Frequency and Voltage Phasors, IEEE 0-7803-3143-5 pp. 115-118, 1996.

Sezi, A New Method for Measuring Power System Frequency, NWPPA Engineering and Operations Conference, Spokane, WA, Apr. 17-21, 2000.

Schadev, A New Algorithm for Digital Impedance Relays, IEEE PAS-98, vol. 2, No. 4, Dec. 1979, pp. 253-260.

Benmouyal, An Adaptive Sampling-Interval Generator for Digital Relaying, IEEE Transactions on Power Delivery, vol. 4, No. 3, Jul. 1989.

Benmouyal, Removal of DC Offset in Current Waveform Using Digital Mimic Filtering, IEEE Transactions on Power Delivery, vol. 2, No. 2, pp. 621-630, Apr. 1995.

Wang, Frequency Responses of Phasor-Based Microprocessor Relaying Algorithms, IEEE Transaction on Power Delivery vol. 14, No. 1, Jan. 1999.

Yang, et. al., A Precise Calculation of Power System Frequency and Phasor, IEEE Transactions on Power Delivery, vol. 15, No. 2, Apr. 2000.

Schweitzer III, et. al., Filtering for Protective Relays, 19th Annual Western Protective Relay Conference, Spokane, WA, 1992.

* cited by examiner

ACQUIRING PHASORS OUTSIDE THE FREQUENCY TRACKING RANGE FOR POWER PROTECTIVE RELAYS

TECHNICAL FIELD

This disclosure relates to measuring phasor values corresponding to voltage and current waveforms in an electric power system. More particularly, this disclosure relates to measuring phasor values when the actual frequency of the electrical power system is outside of a frequency tracking range.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

I. Overview

Protection, automation, control, and metering of electrical power systems requires specific knowledge of the state of the system. This specific knowledge is beneficial in recognizing and understanding disturbances in the power system. Electrical power systems include a variety of power system elements such as generators, motors, power transformers, power transmission lines, buses, and capacitors, to name a few. Electric power systems also generally include various monitoring devices, control devices, metering devices, and protective devices (e.g. protective relays). In most cases, these devices are microprocessor-based or "intelligent" electronic devices (IEDs), that utilize phasors (i.e., a constant complex number representing a sinusoidal function of time) to perform their respective function(s). The phasors are derived from local or shared remote measurements sampled from a signal waveform such as, for example, currents and/or voltages of the electric power system.

Regardless of whether the phasors are derived from local or remote measurements, the accuracy of such measurements is of paramount importance when achieving a desired level of electrical power system performance. Such accuracy is predicated on both the accuracy of the measurement itself and the accuracy of the knowledge of the acquisition time of the measurement.

Electrical power systems typically operate at a predetermined frequency ("rated frequency" or "nominal frequency"). For example, in the United States most electrical power systems operate at a rated frequency of 60 Hz, and in Europe most electrical power systems operate at a rated frequency of 50 Hz. The actual frequency of the power system can vary depending on the operations of the power system elements. These variations in the actual power system frequency can cause errors in phasor calculations when the phasor calculation uses the rated power system frequency to calculate the phasor.

One example of frequency variations can be described using a generator. A synchronous generator during startup may begin operating at 0 Hz and accelerate until it reaches the rated frequency of the power system. During this acceleration the generator passes through the range of frequencies from 0 Hz to the rated frequency. Further, because generators are driven by a source of mechanical energy that may be unpredictable at times, the generator may be caused to accelerate beyond the rated frequency. If the IED used to protect the generator calculates phasors based on the rated frequency during startup conditions and/or where the generator exceeds the rated frequency, it is likely that the IED will cause the generator to trip. This trip may be a misoperation in that it may have been desirable for the generator to operate at a frequency other than the rated frequency. Indeed, because the range of possible operating frequencies through which accurate phasor measurements are needed for protection, automation, control or metering, a system and method are needed to calculate accurate phasors through the entire range of possible operating frequencies for generators specifically and electric power systems in general.

Accordingly, described herein is a system and method for calculating phasors when the actual power system frequency varies from the rated power system frequency. Specifically described is a system that samples an electrical power system at a rate based on the actual frequency of the power system when the actual frequency of the power system is within a predefined frequency tracking range and calculates phasors therefrom. When the frequency exceeds the maximum of the frequency tracking range, the system samples at a sampling frequency corresponding to the upper end of the range, calculates phasors, and corrects the calculated phasors using the difference between the frequency and the maximum of the frequency tracking range. Similarly, when the frequency is below the tracking range, the system samples at a sampling frequency corresponding to the lower end of the range, calculates phasors, and corrects the calculated phasors using the difference between the frequency and the minimum of the frequency tracking range.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as modules or components. As used herein, a module or component may include any type of hardware, firmware or computer instruction or computer executable code located within a memory device and/or transmitted as electronic signals over a system bus or wired or wireless network. A module or component may, for instance, comprise one or more physical or logical blocks of computer instructions, which may be organized as a routine, program, object, component, data structure, etc., that performs one or more tasks or implements particular abstract data types.

In certain embodiments, a particular module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a machine-readable medium having stored thereon instructions that may be used to program a computer (or other electronic device) to perform processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

Figure 1:
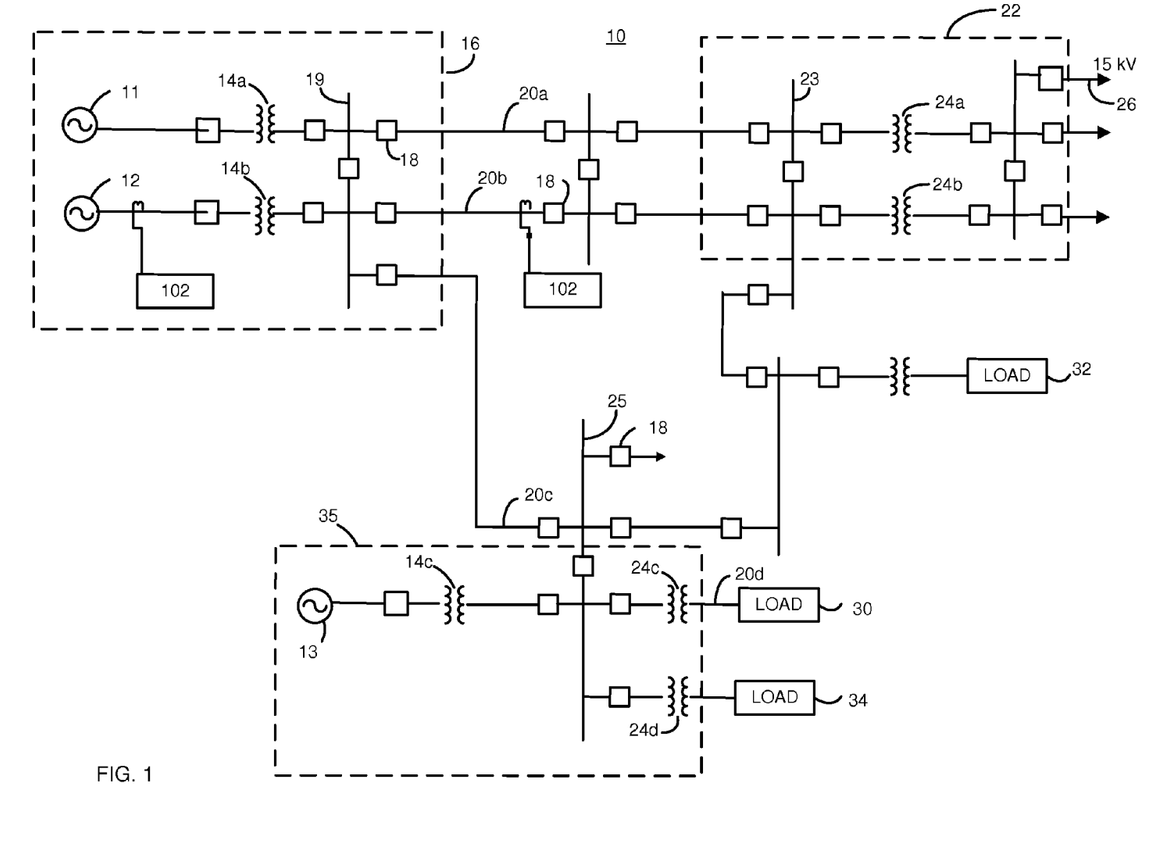
FIG. 1 is a single line schematic of a power system that may be utilized in a typical wide area network.

FIG. 1 is a single line schematic diagram of a power system 10 that may be utilized in a typical wide area. As illustrated in FIG. 1, the power system 10 includes, among other things, three synchronous generators 11, 12 and 13, configured to generate three-phase sinusoidal waveforms such as 12 kV sinusoidal waveforms, three step-up power transformers 14a, 14b and 14c, configured to increase the generated waveforms to a higher voltage sinusoidal waveforms such as 138 kV sinusoidal waveforms and a number of circuit breakers 18. The step-up power transformers 14a, 14b, 14c operate to provide the higher voltage sinusoidal waveforms to a number of long distance transmission lines such as the transmission lines 20a, 20b, 20c and 20d. In an embodiment, a first substation 16 may be defined to include the two synchronous generators 11 and 12, the two step-up power transformers 14a and 14b and associated circuit breakers 18, all interconnected via a first bus 19. A second substation 35 may be defined to include the synchronous generator 13, the step-up power transformer 14c and associated circuit breakers 18, all interconnected via a second bus 25. At the end of the long distance transmission lines 20a, 20b, a third substation 22 may be defined to include two step-down power transformers 24a and 24b configured to transform the higher voltage sinusoidal waveforms to lower voltage sinusoidal waveforms (e.g., 15 kV) suitable for distribution via one or more distribution lines 26 to loads such as a load 32. The second substation 35 also includes two step-down power transformers 24c and 24d to transform the higher voltage sinusoidal waveforms, received via the second bus 25, to lower voltage sinusoidal waveforms suitable for use by respective loads 30 and 34.

A number of intelligent electronic devices (IEDs) 102 are connected at various points in the electric power system 10. For ease of discussion however, only two IEDs 102 are shown. One is operatively connected to the transmission line 20b via a transformer, and another is shown operatively connected to the power output of generator 12 via a transformer. It is to be understood that sampling a power system includes sampling a signal present on any element of the power system such as a generator, a power line, a transformer, a bus, and the like. In general, an IED can be configured to perform one or more of power system protection (e.g., a line current differential protection), automation (e.g., reclosing a circuit breaker), control (e.g., capacitor bank switching) and metering (e.g., power consumption calculation).

As mentioned above, the present invention acquires phasors from a power system and corrects the phasors when the actual frequency is outside of the frequency tracking range. That is, when the power system operates within the frequency tracking range, the power system samples are acquired at a rate corresponding with the frequency of the power system. When the power system frequency is outside of the frequency tracking range, power system samples are acquired at a rate corresponding to the maximum (or minimum, as described above) frequency of the frequency tracking range, and calculated phasors are corrected using the difference between the actual power system frequency and the maximum (or minimum, as described above) frequency of the frequency tracking range.

II. Calculating Phasors within the Frequency Tracking Range

Intelligent Electronic Devices (IEDs) typically sample a power system such that a specific number of samples are acquired during each power system cycle of the sampled waveform. For example, the IED may be configured to obtain 16 samples per power system cycle. Thus for a power system with a frequency of 60 Hz, the IED would obtain 960 samples per second. As the frequency of a power system may vary, the IED may be configured to track the frequency and adjust the rate at which samples are acquired accordingly. That is, an IED may be configured to track the actual power system frequency through a frequency tracking range such as, for example, from about 20 Hz to about 70 Hz and sample the waveform at a rate of from 320 samples per cycle to 1120 samples per cycle according to the power system frequency.

A. Sample Acquisition

Figure 2:
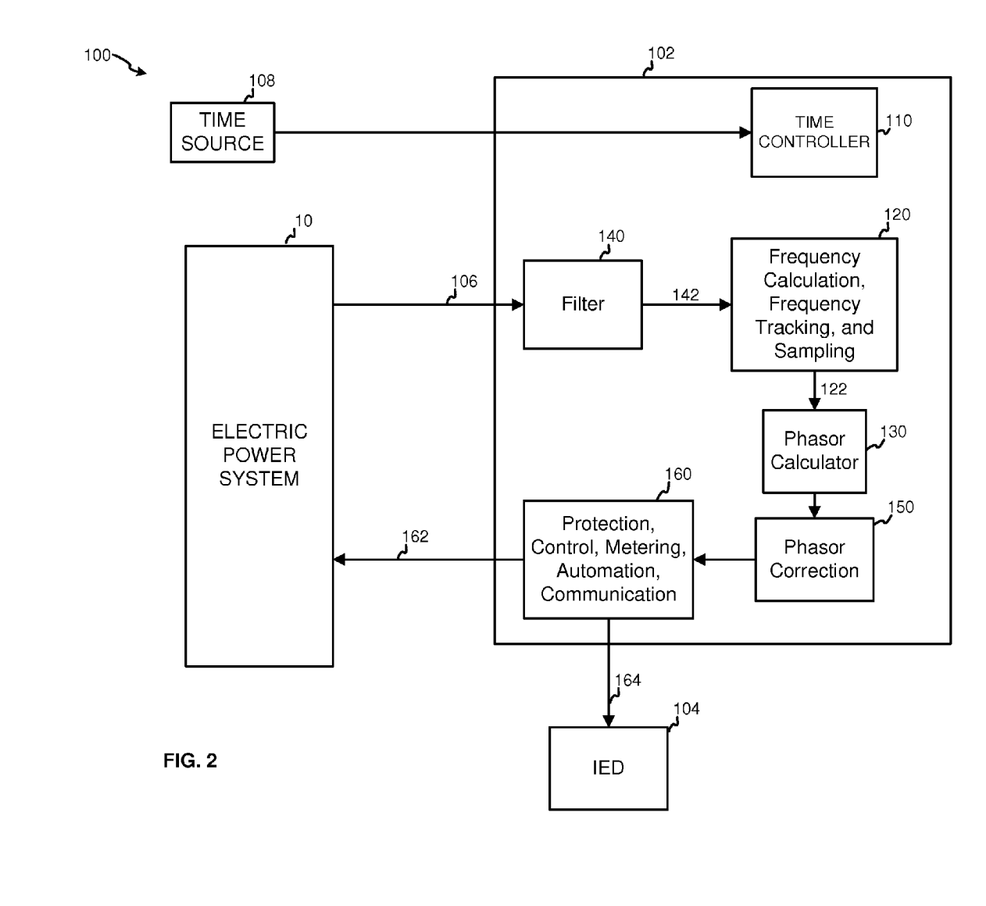
FIG. 2 is a block diagram of a system for acquiring phasors.

FIG. 2 illustrates a simple block diagram of a system configured to sample the power system at a rate corresponding with the frequency of the power system. The system 100 includes a time source, described herein as common time 108. The common time 108 is a time signal that may be uniform time among the various power system devices (such as IEDs) that may be connected thereto. Common time 108 may be provided via a global positioning system (GPS), and may be communicated using a signal such as IRIG-B. Common time 108 may be provided using a high accuracy clock such as an atomic clock. Another possible source of a common time 108 is WWB or WWVB radio signals. Common time 108 is communicated to a time controller 110 in the IED 102. The time controller provides a time signal as needed to various modules of the IED 102.

The IED also receives signals from the electric power system 10. As illustrated in FIG. 1, IED 102 is connected to the electric power system 10 via a transformer such as a current transformer, voltage transformer, or the like, so as to receive a signal corresponding with the electric power system 10. For simplicity, the embodiments described herein concern an IED 102 that receives power system signals in the form of a waveform. Further, though the electric power system 10 may include various phases, such as an "A" phase, a "B"

phase, and a "C" phase, the embodiments herein described relate only to a single phase, though various or all phases may be monitored using the embodiments described herein.

The IED 102 receives analog signals 106 from the electric power system 10. The IED may include a filter 140 for filtering the received analog signals 106 to provide a filtered signal 142. The filter 140 may be an analog filter such as a low pass filter, and adapted to provide a filtered signal to the frequency calculation, frequency tracking, and sampling module 120. Module 120 is adapted to provide an output 122 including a sampled electric power signal and a determined power system frequency. The output 122 is used by the phasor calculation module 130 to calculate phasors. The phasors may then be corrected as needed in the phasor correction module 150 using the phasors and the determined power system frequency. The corrected phasors are then used to provide electric power system protection, control, metering, and/or automation to the electric power system 10, and may also be communicated in block 160. The protection, control, or automation output 162 may be applied directly to the electric power system 10. The output of the protection, control, automation, or metering (including the corrected phasors) 164 may further be communicated over a communications network or other IEDs 104.

Figure 3:
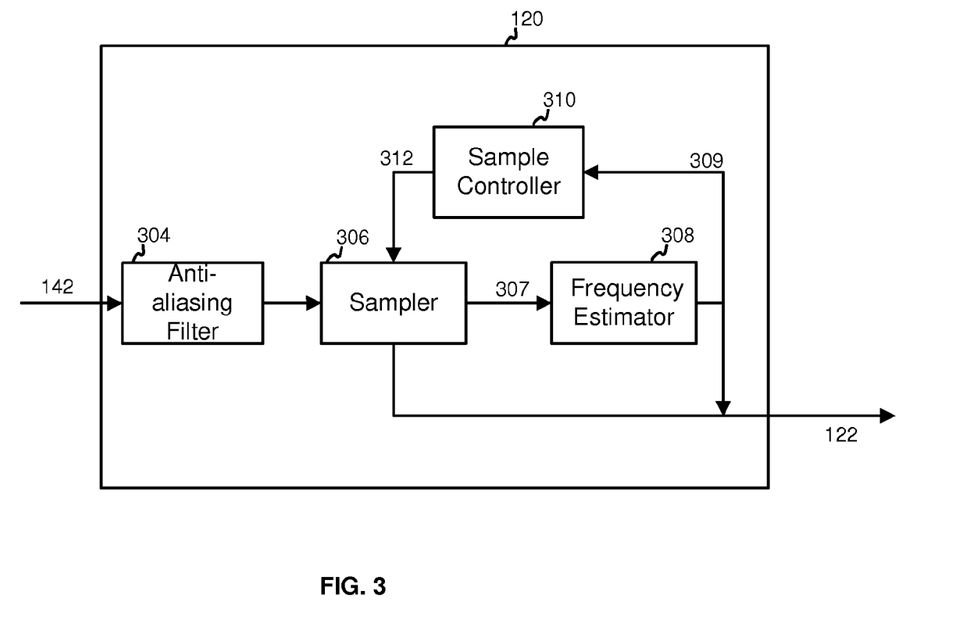
FIG. 3 is a block diagram of the frequency calculation, frequency tracking, and sampling block of FIG. 2.

FIG. 3 illustrates a possible embodiment of the frequency calculation, tracking and sampling module 120. As described above, this module 120 is adapted to determine power system frequency and sample the power system signal based on the power system frequency. Various methods of performing power system frequency estimation are described in U.S. Pat. Nos. 6,845,333, 6,662,124, and 6,603,298, and US Patent Application Publication No. 2007/0086134, all of which are herein incorporated by a reference in their entireties. The frequency and sampling module 120 may be adapted to sample at a rate that is a multiple of the power system frequency. For example, the sample module 306 may be adapted to sample at a rate of 16 or 32 samples per cycle. This may be accomplished by multiplying the determined power system frequency by the sampling rate (on a per-cycle basis), and taking the resultant number of samples per second as follows, where $N_s$ is the number of samples per second, k is the sampling rate on a per-cycle basis, and $f_{sys}$ is the power system frequency:

$$N_s = kf_{sys} \quad (1a)$$

As can be seen in the above equation, as the power system frequency $f_{sys}$ increases, so does the sampling rate. Various technological restraints and system requirements present disincentives to sample at rates above and below certain thresholds. For example, when the power system frequency falls below a threshold the phasor outputs may be impractical because other protection, automation, control, or metering requirements are used. Specifically, when a generator is being monitored, its frequency at startup would be well below the rated system frequency, and it would most likely be monitored, controlled and protected by an alternative scheme in which phasor measurements are not necessary. When the power system frequency increases above a certain threshold, for example, the protection, monitoring, control, or metering functions may not be capable of providing an output commensurate with the rate that samples are taken. For example, when the power system frequency increases above 70 Hz, the phasor calculator may lack the necessary processor speed to calculate phasors as the samples are taken. The result would be slipping between the samples and the output of the phasor calculator. According to the present invention, the frequency and sampling module 120 samples at a rate corresponding to a the power system frequency when the power system frequency is within a predetermined frequency tracking range. When the power system frequency is outside of the tracking range, however, the frequency and sampling module 120 is adapted to sample the power system at a rate corresponding to the high end (or low end, as is needed) of the frequency tracking range, as can be seen in equation 1b where $f_{track\_min}$ is the minimum of the frequency tracking range and $f_{track\_max}$ is the maximum of the frequency tracking range:

$$N_s = \begin{cases} kf_{track\_min} & \text{for } f_{sys} \leq f_{track\_min} \\ kf_{sys} & \text{for } f_{track\_min} < f_{sys} < f_{track\_max} \\ kf_{track\_max} & \text{for } f_{track\_max} \leq f_{sys} \end{cases} \quad (1b)$$

As depicted in FIG. 3, the filtered analog signal 142 is further filtered by an antialiasing filter module 304 to provide a filtered signal to the sampler module 306 (for example, an analog-to-digital converter (A/D)), which is adapted to sample the electric power system signal at a rate corresponding with the system frequency as described herein. The sampled signal from the sampler module 307 is an input to the frequency estimator module 308 which uses the sampled signal 307 to provide an estimated power system frequency $f_{sys}$ 309. One of several different types of frequency estimation may be used by the system. One exemplary frequency estimator that may be used is discussed in *A New Measurement Technique for Tracking Voltage Phasors, Local System Frequency, and Rate of Change of Frequency*, Phadke, et al, IEEE Transactions on Power Apparatus and Systems, Vol. PAS-102 No. 5, May 1983 (herein incorporated by reference). The frequency estimator 308 outputs the estimated frequency $f_{sys}$ 309 to the sample controller module 310. The sample controller 310 uses the estimated frequency $f_{sys}$ to send a sampling pulse 312 to the sampler module 306 that controls the instants at which the sampler module 306 is to sample the filtered signal from the anti-aliasing filter module 304. Thus, the sample controller 310 controls the sampling rate $N_s$, which is commensurate with the electric power system frequency $f_{sys}$. The sample controller 310 operates according to the frequency tracking ranges as discussed above in Equation 1b such that when the estimated system frequency $f_{sys}$ is equal to or below the frequency tracking range, the sampling pulse 312 is such that the sampler module 306 samples at a rate corresponding with the low end of the frequency tracking range. When the estimated frequency $f_{sys}$ is within the frequency tracking range, the sampling pulse 312 is such that the sampler module 306 samples corresponding to the estimated frequency $f_{sys}$. When the estimated frequency $f_{sys}$ is greater than or equal to the upper end of the frequency tracking range, the sampling pulse 312 is such that the sampler module 306 samples at a rate corresponding with the upper end of the frequency tracking range.

The sampler module 306 outputs a signal representative of the sampled signal, sampled at a rate controlled by the sample controller module 310 that corresponds with the frequency tracking described herein. This signal along with the estimated power system frequency $f_{sys}$ 309 is output 122 to the phasor calculator 130 (FIG. 2). As discussed above and in one example, the modules of the frequency calculation, frequency tracking and sampling module 120 may be performed jointly or separately using, for example, a microprocessor, a field programmable gate array (FPGA), application specific integrated circuit (ASIC) or the like.

The sample controller 310 functions similarly for frequencies below the low end of the frequency tracking range by sending a sampling pulse 312 at a rate corresponding to the minimum of the frequency tracking range. For example, if the frequency tracking range is from 20 Hz to 70 Hz, the estimated frequency is 60.2 Hz, and the desired number of samples per cycle is 32, then the sample controller 310 will send a sampling pulse 312, and the sampler module 306 will sample at a rate of 1,926.4 samples per second (corresponding to a power system frequency of 60.2 Hz). However, if the actual frequency is 75 Hz, the sample controller 310 will send a sampling pulse 312, and the sampler module 306 will sample at a rate of 2240 samples per second (corresponding to a power system frequency of 70 Hz). Likewise, if the actual frequency is 15 Hz, the sample controller 310 will send a sampling pulse 312, and the sampler module 306 will sample at a rate of 640 samples per second (corresponding to a power system frequency of 20 Hz). It should be noted that where the term "actual frequency" is used herein, there may be some lag between the instantaneous actual power system frequency and the actual frequency as determined using the disclosed invention.

B. Sample Processing

1. Phasor Calculation

Returning now to FIG. 2, the output 122 including the sampled power system signal and a determined power system frequency is used by a phasor calculator 130. The phasor calculator 130 may calculate fundamental power system voltage and/or current phasors using methods described in U.S. Pat. Nos. 6,845,333, 6,662,124, 6,934,654, or US Patent Application Publication 2007/0086134, the entirety of each of which is herein incorporated by reference. For example, the phasor calculator may use a pair of numerical filters such as a pair of orthogonal digital finite impulse response (FIR) filters to produce the fundamental phasors representing the voltage and/or current waveforms of a power system. FIR filters provide an impulse response that is zero outside some finite time interval. Some examples of these filters include a Fourier filter and a Cosine filter. The gain may be selected as unity at the tracked power system frequency when the frequency is within the frequency tracking range, and such that the phase angle between the two outputs of the orthogonal filters is 90° at that frequency. Thus, the output of the phasor calculator 130 is a set of complex numbers that represent the fundamental component phasors for the power system voltage and/or current waveforms, and the determined power system frequency.

The output of the phasor calculator module 130 is then provided to a phasor correction module 150 adapted to correct the phasors when the power system frequency is outside of the frequency tracking range. If, however, the power system frequency is within the frequency tracking range, the phasor measurements are not changed by the phasor correction module 130, but are provided to various IED functional modules such as protection, control, metering, automation, and/or communication modules, illustrated together as module 160. Module 160 may perform a number of protection, control, automation, metering, and/or communication calculations on the phasors, and provide outputs to the electric power system 10 or other IEDs 104 either directly or using a network (not illustrated). For example, if the calculations on the phasors suggest a fault on the electric power system 10, the protection module 160 may issue a trip command to a breaker, thus isolating a portion of the electric power system 10. Data may also be calculated from the phasors, and communicated to other IEDs 104 either directly or over a network.

2. Correcting Phasors Outside of the Frequency Tracking Range

As described above and in conjunction with phasor correction module 150, when the power system frequency is outside of the frequency tracking range, the phasors calculated by the phasor calculator 130 may contain errors. For these situations, the phasor correction module 150 uses the phasors and the determined power system frequency to correct the phasors. A true phasor of a voltage or current waveform can be represented by equation (2):

$$X = X_R + jX_I \qquad (2)$$

In Equation 2, X represents the true phasor, $X_R$ represents the real component, and $X_I$ represents the imaginary component. When the phasor is calculated at a frequency other than the frequency at which it was sampled (i.e. when the actual frequency is outside of the frequency tracking range), the phasor as measured will include errors. The measured phasor $X_{mes}$ may be represented by equation (3) where $X_{mes\_R}$ and $X_{mes\_I}$ indicate the real and imaginary phasor components, respectively:

$$X_{mes} = X_{mes\_R} + jX_{mes\_I} \qquad (3)$$

The true phasor may be calculated from the measured phasor by applying a linear transformation on the measured phasor coordinates as represented in equation (4) where A, B, C, and D represent correction coefficients, and $\Delta\omega$ represents the frequency deviation between the maximum (or minimum, if the frequency is below the frequency tracking range) of the frequency tracking range and the power system frequency at the time the data was collected:

$$\begin{bmatrix} X_R \\ X_I \end{bmatrix} = \begin{bmatrix} A(\Delta\omega) & B(\Delta\omega) \\ C(\Delta\omega) & D(\Delta\omega) \end{bmatrix} \cdot \begin{bmatrix} X_{mes\_R} \\ X_{mes\_I} \end{bmatrix} \qquad (4)$$

The correction coefficients A, B, C, and D can be calculated using equation (5), where $P_R$, $P_I$, $Q_R$ and $Q_I$ are the components of two complex numbers defined in equations (6) through (9), where the correction factors P and Q are for a full-cycle Cosine filters:

$$\begin{bmatrix} A(\Delta\omega) & B(\Delta\omega) \\ C(\Delta\omega) & D(\Delta\omega) \end{bmatrix} = \begin{bmatrix} (P_R + Q_R) & (Q_I - P_I) \\ (P_I + Q_I) & (P_R - Q_R) \end{bmatrix}^{-1} \qquad (5)$$

$$P = P_R + jP_I \qquad (6)$$

$$Q = Q_R + jQ_I \qquad (7)$$

$$P = \frac{1}{2N}\left[1 - e^{j\frac{N}{4}(\omega_{max} + \Delta\omega\Delta T_{max})}\right] \cdot \left[\frac{\sin N\theta_1}{\sin\theta_1}e^{j(N-1)\theta_1}\right] \cdot \left[\frac{\sin N\theta_2}{\sin\theta_2}e^{j(N-1)\theta_2}\right] \qquad (8)$$

$$Q = \frac{1}{2N}\left[1 - e^{-j\frac{N}{4}(\omega_{max} + \Delta\omega\Delta T_{max})}\right] \cdot \left[\frac{\sin N\theta_1}{\sin\theta_1}e^{-j(N-1)\theta_1}\right] \cdot \left[\frac{\sin N\theta_2}{\sin\theta_2}e^{-j(N-1)\theta_2}\right] \qquad (9)$$

In equations (8) and (9), N indicates the number of samples in the filter data-window, $\omega_{max}$ is the maximum frequency of the frequency tracking range (or minimum of the frequency tracking range if the estimated frequency is at or below the minimum of the frequency tracking range), $\Delta\omega$ is the difference in frequency between the estimated system frequency and $\omega_{max}$ (or $\omega_{min}$ the minimum frequency of the frequency tracking range when the estimated frequency is at or below the minimum of the frequency tracking range), $\Delta T_{max}$ is the filter sampling interval in seconds given as the inverse of the maximum frequency of the frequency tracking range (or the minimum frequency of the frequency tracking range when the estimated frequency is at or below the minimum of the frequency tracking range), and $\theta_1$ and $\theta_2$ are defined in equations (10) and (11):

$$\theta_1 = \frac{\Delta\omega\Delta T_{max}}{2} \quad (10)$$

$$\theta_2 = \frac{\Delta\omega\Delta T_{max} + \frac{4\pi}{N}}{2} \quad (11)$$

In equations (8) and (9), $\omega_{max}$, N, and $\Delta T_{max}$ are fixed so that P and Q will only depend upon the frequency deviation $\Delta\omega$, thus, correction coefficients A, B, C, and D will be functions of the frequency deviation $\Delta\omega$.

In systems where Cosine filters are not used, correction factors P and Q may be calculated (as in U.S. Pat. No. 6,934,654, the entirety of which is herein incorporated by reference) based on the type of filter using equations (12) and (13) where $a_k$ and $b_k$ are coefficients of the FIR filters:

$$P(\Delta\omega) = \frac{1}{2}\sum_{k=0}^{N-1} e^{j(\omega_{max}+\Delta\omega)k\Delta T_{max}}(a_k + jb_k) \quad (12)$$

$$Q(\Delta\omega) = \frac{1}{2}\sum_{k=0}^{N-1} e^{-j(\omega_{max}+\Delta\omega)k\Delta T_{max}}(a_k + jb_k) \quad (13)$$

Using equations (2) through (11), then, phasor correction module 150 can calculate the true phasor X based on the real and imaginary parts of the measured phasor ($X_{meas\_R}$ and $X_{meas\_I}$, respectively) and the frequency deviation $\Delta\omega$ between the maximum of the frequency tracking range and the actual power system frequency.

Figure 4:
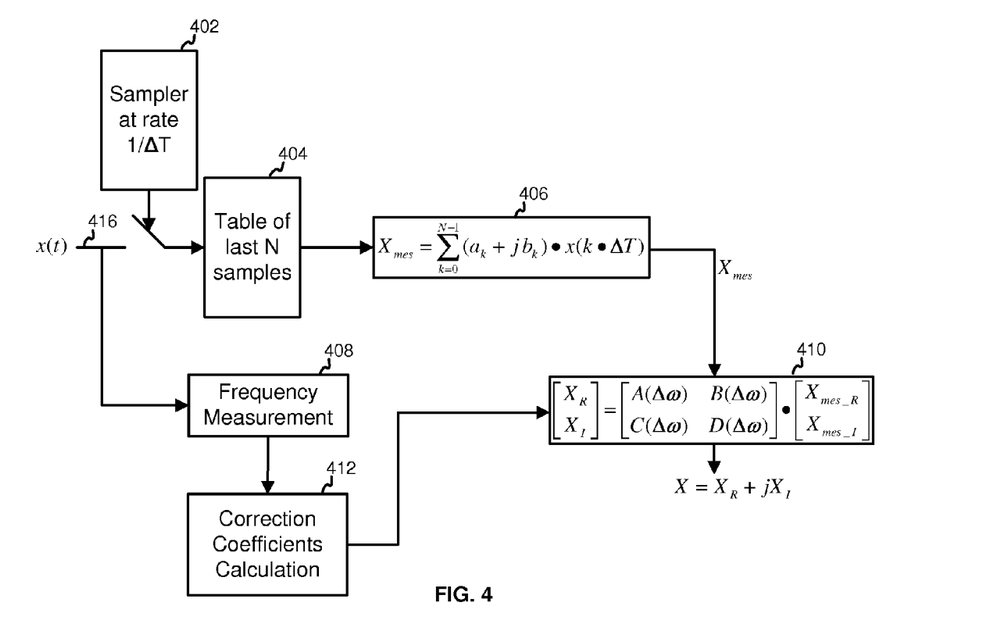
FIG. 4 is a functional block diagram of a system for acquiring phasors.

FIG. 4 is a general block diagram showing the phasor compensation according to the present invention. The system of FIG. 4 includes a power system signal input x(t) 416 from the electric power system and a sampling circuit 402 and resulting table of stored values 404 (the last N samples), which are then operated on by calculation module 406. Calculation module 406 may include a pair of orthogonal filters. For example, the calculation module 406 may apply equation 14:

$$X_{mes} = \sum_{k=0}^{N-1}(a_k + jb_k)\cdot x(k\cdot\Delta T) \quad (14)$$

A measured phasor $X_{mes}$ results, which is applied to phasor correction module 410. The frequency of the power system signal is measured with a frequency measurement module 408, and the determined frequency is applied to the coefficient calculation module 412, described in more detail below. Using the measured phasor $X_{mes}$ and the calculated coefficients, the phasor correction module 410 uses methods described herein to correct the measured phasor, resulting in an accurate phasor.

As described above, correction coefficients A, B, C, and D are functions of the frequency deviation $\Delta\omega$. To determine correction coefficients for a particular system using a selected filter arrangement, the filter coefficients $a_k$ and $b_k$ must be determined. P and Q correction factors can then be calculated for a number of frequency deviations $\Delta\omega$ using, for example, equations (12) and (13). Sets of the four correction coefficients A, B, C, and D can then be calculated for each frequency deviation $\Delta\omega$ using equation (5). Using the sets of the four correction coefficients A, B, C, and D, a number of methods can be used to determine a particular correction coefficient for a particular frequency deviation $\Delta\omega$. For example, each of the four correction coefficients A, B, C, and D can be plotted against a set of frequency deviations $\Delta\omega$ for which the correction coefficients were calculated such that for any frequency deviation within the range of the plot the correction coefficient may be determined. In another example, a polynomial expansion for each of the four correction coefficients may be determined as a function of the frequency deviation such that for any frequency deviation the correction coefficient may be determined using the polynomial expansion. Further, using either the plot or the polynomial expansion a lookup table for each of the four correction coefficients may be created for a number of frequency deviations. The lookup table may be used to determine a value for a correction coefficient at a particular frequency deviation using interpolation.

The coefficient calculation module 412 uses the frequency deviation $\Delta\omega$ to determine appropriate correction coefficients A, B, C, and D. For example, the coefficient calculation module 412 may include a lookup table for each of the correction coefficients A, B, C, and D, and use interpolation to determine a value for each of the coefficients at the desired frequency deviation $\Delta\omega$. Alternatively, the coefficient calculation module 412 may include a polynomial expansion for each of the correction coefficients A, B, C, and D, and calculate a value for each of the correction coefficients for the desired frequency deviation $\Delta\omega$. The coefficients are then provided to the phasor correction module 410 to correct the phasors, if needed.

In the case where the measured frequency is within the frequency tracking range, the frequency deviation $\Delta\omega$ would be zero. In this case, the correction coefficients A, B, C, and D would be such that no phasor correction would take place even if the phasor correction module 150 were employed. That is, correction coefficients A and D would be unity, and B, and C would be zero for the case where the measured frequency is within the frequency tracking range (i.e. where the frequency deviation is zero). Thus, in effect, the measured phasors would not be corrected for the case where the frequency deviation $\Delta\omega$ is zero.

In an embodiment, the coefficient calculation module 412 and the phasor correction module 410 are not utilized when the frequency deviation $\Delta\omega$ is zero. In this embodiment, the measured phasors need no correction because there would be no discrepancy between the sampling frequency and the signal frequency.

Figure 5:
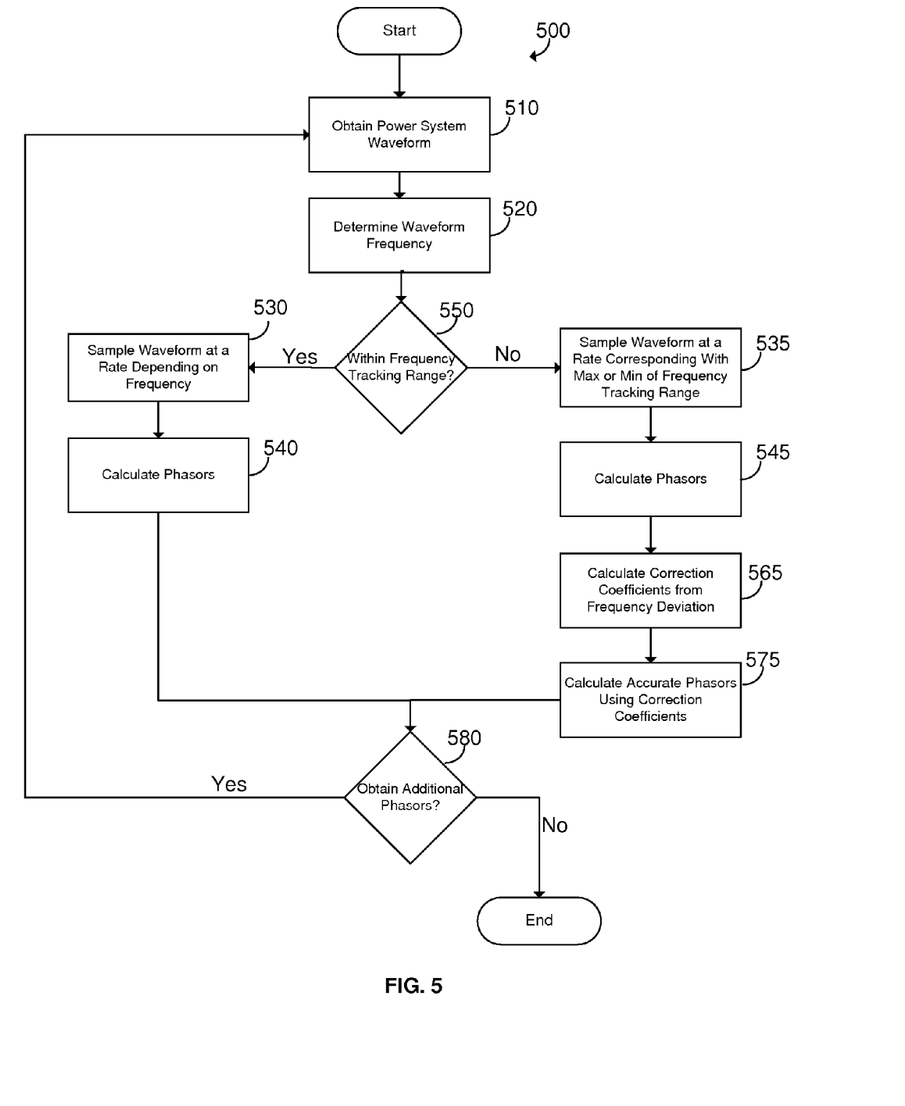
FIG. 5 is a flowchart illustrating a method for acquiring phasors.
Figure 6:
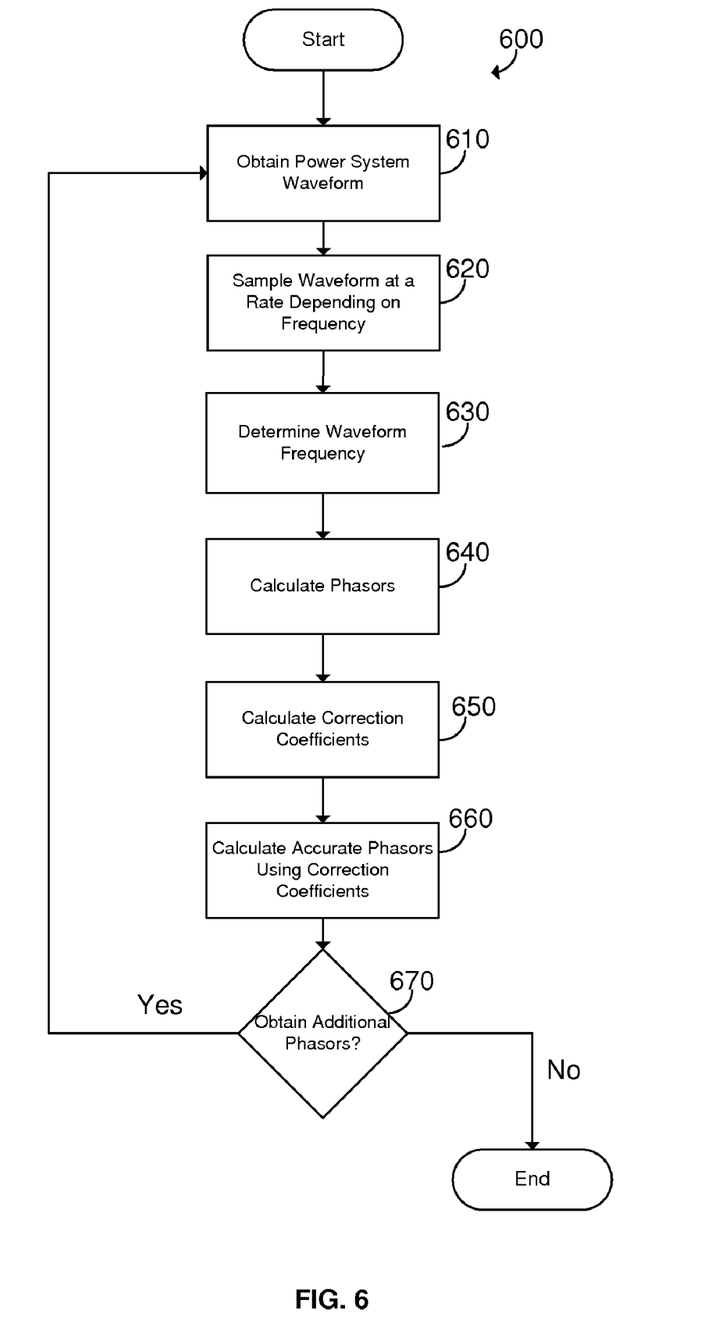
FIG. 6 is a flowchart illustrating a method for acquiring phasors.

Methods of using the system disclosed herein are illustrated in the flow charts of FIGS. 5 and 6. According to FIG. 5, a method 500 for determining accurate fundamental phasors of a signal waveform over a range of frequencies of the waveform is illustrated. According to this method, a power system signal such as a voltage or a current signal is obtained from the electric power system 510. A frequency of the power system signal is then determined 520. The frequency is then compared with the frequency tracking range to determine whether the frequency is within the frequency tracking range 550. If the frequency is within the frequency tracking range, then the power system signal is sampled 530 at a rate that depends on the frequency of the power system from step 520. Fundamental phasors are then calculated using the sampled power system signal in step 540. If additional phasors are required 580, then the method restarts with step 510, obtaining a power system signal waveform. If no additional phasors are required, then the method ends.

Back to step 550, if the frequency is outside of the frequency tracking range, then the power system signal is sampled at a rate corresponding with the maximum (or minimum, as required) of the frequency tracking range 535. Phasors are then calculated 545 using the sampled power system signal. The frequency deviation between the determined frequency from step 520 and the maximum (or minimum, as required) of the frequency tracking range is determined and used to calculate the correction coefficients 565. The calculated phasors are corrected using the correction coefficients 575, resulting in accurate phasors. Again, if additional phasor measurements are required 580, the method returns to step 510 to obtain power system waveform.

In FIG. 6, a method 600 for determining accurate fundamental phasors of a signal waveform over a range of frequencies of the waveform is illustrated. According to this method, a power system signal such as a voltage or a current signal is obtained from the electric power system 610. The waveform is sampled 620 at a rate corresponding with a frequency when the frequency is within the frequency tracking range, or at a rate that corresponds with the maximum (or minimum, as required) of the frequency tracking range if the frequency is outside of the frequency tracking range. A frequency of the power system signal is then determined 630. Fundamental phasors are then calculated using the sampled waveform 640. The method calculates correction coefficients 650 that are functions of a deviation between the determined frequency from step 620 and the maximum (or minimum, as required) of the frequency tracking range. The correction coefficients are used to correct the phasors 660, thus calculating accurate phasors. If additional phasors are required 670, then the method repeats starting with step 610, obtaining a power system waveform. Otherwise, the method ends. As described above, if the frequency is within the frequency tracking range then the coefficients are such that no correction is effected in step 660.

As is known in sampling of an analog waveform signal, the sampling may yield an inaccurate representation of the signal waveform if harmonics exist in the signal waveform. Depending on the filter used (for example, the full-cycle cosine filter as described above) and the frequency deviation Δω, harmonics may present various degrees of inaccuracy in the signal processing. To compensate, a low-pass filter (such as, for example, a 4-sample averager) may be used when calculating the magnitude from the corrected phasor measurements. The low-pas filter may be a module within the phasor correction module 150, or a module within the protection, control, metering, automation, and communication module 160.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A method for obtaining a phasor of a signal waveform, comprising:
   tracking a frequency of the signal waveform;
   sampling the signal waveform at a sampling rate;
   adjusting the sampling rate to correspond to the frequency of the signal waveform when the frequency is within a predetermined range of frequencies to provide data samples;
   calculating a phasor using the data samples; and,
   correcting the phasor when the frequency of the signal waveform is outside of the predetermined range of frequencies.

2. The method of claim 1, wherein the sampling rate corresponds to an upper limit of the predetermined range of frequencies when the frequency exceeds the predetermined range of frequencies.

3. The method of claim 1, wherein the correcting comprises multiplying a real part of the phasor and an imaginary part of the phasor by compensating factors.

4. The method of claim 3, wherein the compensating factors are functions of the difference between the frequency of the signal waveform and an upper limit of the predetermined range.

5. The method of claim 3, further comprising determining the compensating factors from a look-up table based on the difference between the frequency of the signal waveform and an upper limit of the predetermined range.

6. The method of claim 3, further comprising determining the compensating factors from polynomial approximations.

7. The method of claim 3, wherein the compensating factors correspond to a set of orthogonal filters of the finite impulse response type.

8. A system for determining accurate fundamental phasors of a signal waveform oscillating at a frequency, comprising:
   a frequency estimation module for calculating a frequency of the signal waveform
   a sampling module in communication with the frequency estimation module for sampling the signal waveform at a sampling rate and adjusting the sampling rate to correspond to the frequency when the frequency is within a predetermined range;
   a phasor calculation module system in communication with the sampling module for determining a measured phasor representing the signal waveform, the measured phasor including a real part and an imaginary part; and,
   a phasor correction module in communication with the frequency estimation module and the phasor calculation module, and using a plurality of compensating factors for correcting the measured phasor when the frequency is outside of the predetermined range.

9. The system of claim 8, wherein the sampling rate corresponds to an upper limit of the predetermined range for frequencies exceeding the predetermined range.

10. The system of claim 8, wherein the predetermined range comprises from about 20 Hz to about 70 Hz.

11. The system of claim 8, wherein the predetermined range comprises an upper limit related to a processing speed of the system.

12. The system of claim 8, wherein the phasor correction module is configured to multiply the real part and the imaginary part of the measured phasor by a compensating matrix including elements with values that are all non-zero, the elements including the plurality of correction factors.

13. The system of claim 8, wherein the phasor correction module is configured to multiply the real part and the imaginary part of the measured phasor by a compensating matrix including elements with values that are not all non-zero, the elements including the plurality of correction factors, when the frequency is within the frequency tracking range.

14. The system of claim 8, wherein the phasor correction module corrects the measured phasor depending on the difference between the frequency and the upper limit of the predetermined range.

15. The system of claim 8, wherein the phasor calculation module system comprises a set of orthogonal finite impulse response filters.

16. The system of claim 8, further comprising a low-pass filter in communication with the phasor correction module.

17. A method for determining accurate fundamental phasors of a signal waveform over a range of frequencies of the waveform, comprising:
- tracking a frequency of the signal waveform;
- sampling the signal waveform at a sampling rate;
- adjusting the sampling rate to correspond to the frequency when the frequency is within a predetermined range of actual frequencies;
- determining a measured phasor representing the signal waveform, the measured phasor including a real part and an imaginary part; and,
- correcting the measured phasor when the frequency exceeds the predetermined range.

18. The method of claim 17, wherein the sampling rate corresponds to an upper limit of the predetermined range when the frequency exceeds the predetermine range.

19. The method of claim 18, wherein the predetermined range comprises from about 20 Hz to about 70 Hz.

20. The method of claim 17, wherein the predetermined range comprises an upper limit related to a processing speed of a system.

21. The method of claim 17, wherein the correcting step comprises multiplying the real part and the imaginary part of the measured phasor by a compensating matrix, wherein the matrix includes elements with values that are all non-zero, the elements including the plurality of correction factors.

22. The method of claim 17, wherein the correcting step comprises multiplying the real part and the imaginary part of the measured phasor by a compensating matrix, wherein the matrix includes elements with values that are not all non-zero, the elements including the plurality of correction factors, when the frequency is within the predetermined range.

23. The method of claim 18, wherein the correcting step corrects the measured phasor depending on the difference between the frequency and the upper limit of the predetermined range.

24. The method of claim 20, wherein the elements of the compensating matrix are determined to correspond to a set of orthogonal filters of the finite impulse response type.

\* \* \* \* \*